United States Patent [19]

Burch

[11] Patent Number: 5,383,137
[45] Date of Patent: Jan. 17, 1995

[54] EMULATION SYSTEM AND METHOD FOR DEVELOPMENT OF A LOW POWER DATA PROCESSOR

[75] Inventor: Kenneth R. Burch, Austin, Tex.

[73] Assignee: Motorola, Inc., Schaumburg, Ill.

[21] Appl. No.: 984,755

[22] Filed: Dec. 3, 1992

[51] Int. Cl.6 .................................... G01R 19/00
[52] U.S. Cl. .......................... 364/578; 364/483
[58] Field of Search ............... 364/483, 488, 489, 490, 364/578, 550, 551.01; 371/18; 395/500

[56] References Cited

U.S. PATENT DOCUMENTS 4,815,024  3/1989  Lewis .......................... 364/578 X
5,077,763  12/1991  Gagnoud et al. .................... 377/16

OTHER PUBLICATIONS

"CDS8 System M68HC05 Family Software Operations Manual for MS-DOS" published by Motorola, Inc. in Feb. 1990, pp. 1-1 to 1-4, 5-1, 7-1 to 7-17.

*Primary Examiner*—Emanuel T. Voeltz
*Assistant Examiner*—Edward Pipala
*Attorney, Agent, or Firm*—Elizabeth A. Apperley

[57] ABSTRACT

An emulation system (10) provides a plurality of circuits (20,28) which each emulate operation of a predetermined component of a target microprocessor (24). Each of the plurality of circuits (20,28) imitates a corresponding component of the target microprocessor (24). A power supply (12) provides power to both the target microprocessor and the plurality of circuits. A first voltage value is provided to a plurality of bus drivers (22, 26, 30). A second voltage value is provided to an internal circuit of each of target microprocessor (24) and the plurality of circuits (20, 28). A current measured between the power supply and each of the circuits accurately reflects a current drawn by the circuits. By designing the target microprocessor and the plurality of circuits such that the power supplied to each is separated from the power supplied to the bus drivers of each of the devices, the operating current of the internal circuitry is accurately measured in real time.

21 Claims, 2 Drawing Sheets

EMULATION SYSTEM AND METHOD FOR DEVELOPMENT OF A LOW POWER DATA PROCESSOR

FIELD OF THE INVENTION

This invention relates generally to an emulation system, and more particularly to using an emulation system to measure a current drawn by a data processor during operation.

BACKGROUND OF THE INVENTION

As laptop computers and other portable data processing systems have entered the consumer marketplace, the need for low power data processors has increased dramatically. Low power data processors enable laptop computers and other portable systems to use a battery as a power supply for a longer period of time before replacement or recharging. Generally, circuitry within low power data processors is designed such that overall power consumption is reduced. While the circuit design of a low power data processor reduces power consumption, the software developed by a user must also be optimized to obtain maximum power efficiency. Use of different instructions and even different data in a software program results in widely varying power requirements in any data processor.

Optimizing the power consumption of software in a data processor is presently a difficult problem for most users. A particularly difficult problem is accurately measuring a current drawn by a data processor during execution of a software program. In one method for measuring power consumption of software, the software code is written and programmed into a read-only memory on the data processor integrated circuit before the actual power consumption is known. The power consumed by the processor is then determined by measuring the current after the integrated circuit is manufactured. This method is both slow and expensive. A user must wait until after a part is manufactured to determine if his or her code is optimized for maximum power efficiency. Then, if the code is not optimal and needs to be modified, the user must make corrections and re-program the memory of the data processor. Subsequently, the user must wait while the new version of the data processor is again manufactured to determine if the new code is optimal.

Additionally, a characterization program must typically be developed to measure the operating current and, therefore, the power consumption of the data processor. The characterization program generally measures the total operating current of the data processor and is not able to measure the current of each of the components of the data processor separately. For example, a data processor may include a central processing unit and several peripheral devices such as a timer and input/output circuits. In characterization programs, all of the components are evaluated jointly to determine power consumption and may not be evaluated separately. This prevents the user from adequately considering trade-offs involved in the choice of particular peripherals to perform a desired function.

In a second method for determining power consumption of a data processor, operation of the data processor is simulated using a software program. Theoretically, simulation allows a user to predict power consumption of a data processor before the data processor is actually manufactured. However, such power consumption estimates are typically inaccurate. Parasitic capacitance and other factors which are normal by-products of implementing a data processor as an integrated circuit are rarely approximated with a high degree of accuracy. Additionally, because of the complexity of a data processor, most simulation methods are able to evaluate only a small portion of the circuitry included in a data processor. As well, ranges of operation temperatures and voltages may not be simulated without consuming a large amount of time. Therefore, while the simulation method may be slightly less expensive than the method previously described, it is still expensive and requires an excessive amount of time.

Sometimes a manufacturer implements a third method of measuring power consumption in a data processor. In the third method, an ultra-violet erasable programmable memory (EPROM) is implemented to allow a user to program and re-program a data processor until power consumption is optimized. Although this method allows the user to optimize a software routine in a data processor, implementation costs are often prohibitive to the manufacturer. Effectively, when using the third method, two data processors must be designed. A first design, as described herein, has an ultra-violet erasable programmable memory and a second design has a mask programmable memory which is loaded with the optimized software program for production purposes. In addition to doubling the design effort, the third method is not completely accurate. The ultra-violet erasable programmable memory typically uses more power than the mask programmable memory. Therefore, the third method is both inaccurate and prohibitively expensive for most applications. Additionally, power consumption of all of the separate components may not be measured individually, but jointly.

In a fourth method for determining power consumption of a software program, operation of a target data processor is evaluated using an emulation system. The emulation system uses the target data processor and a plurality of peripheral circuits to emulate operation of the data processor and to provide for connections to portions of the system normally inaccessible to the user due to the integrated circuit implementation of the target data processor. Each of the plurality of peripheral circuits emulate operation of a particular circuit in the data processor. However, in an emulation system, the current drawn by the target data processor and each of the plurality of peripheral circuits is overshadowed by the current drawn by the bus drivers required by the data processor and the plurality of peripheral circuits. While an emulation system allows the current of each of the internal circuits of a data processor to be approximated, the current measurement does not accurately reflect the current drawn only by the internal circuit. Therefore, emulation systems are rarely used to evaluate the current drawn by the target data processor during execution of a software program.

Therefore, a need exists for a system or method for measuring power consumption of each of the components of a data processor separately. The system or method should also be executed quickly and inexpensively.

SUMMARY OF THE INVENTION

The previously mentioned needs are fulfilled with the present invention. Accordingly, there is provided, in a first form, an emulation system for measuring current.

The emulation system includes a power supply. The power supply has a first output for providing a first voltage value and a second output for providing a second voltage value. The emulation system also includes a target microprocessor. The target microprocessor has a first plurality of bus drivers for communicating digital information and an internal circuit. The target microprocessor has a first input for receiving the first voltage value and a second input for receiving the second voltage value. The first voltage value is provided to the plurality of bus drivers and the second voltage value is provided to the internal circuit. The emulation system also includes a plurality of peripheral devices. Each of the plurality of peripheral devices has both a circuit for emulating operation of a corresponding portion of the internal circuit of the target microprocessor and a second plurality of bus drivers. Each of the plurality of peripheral devices has a first input for receiving the first voltage value and a second input for receiving the second voltage value. The first voltage value is provided to the plurality of bus drivers and the second voltage value is provided to the circuit for emulating operation. The emulation system also includes a plurality of current meters. A first one of the plurality of current meters is coupled to the power supply for receiving the second voltage value and has a bidirectional terminal coupled to the internal circuit of the target microprocessor for measuring a first current value. A remaining portion of the plurality of current meters is coupled to a respective one of the plurality of peripheral devices. Each of the remaining portion of the plurality of current meters is coupled to the power supply for receiving the second voltage value and has a bidirectional terminal coupled to the circuit for emulating operation of each of the plurality of peripheral devices.

In a second embodiment of the invention, there is provided, a method for measuring current with an emulation system. In the method for measuring current, a first voltage value is provided. A second voltage value is also provided. A target microprocessor having a first plurality of bus drivers and an internal circuit is also provided. The internal circuit of the target microprocessor is enabled with the second voltage value. The internal circuit of the target microprocessor is enabled to execute data processing operations. The first plurality of bus drivers is enabled with the first voltage value. The first plurality of bus drivers is enabled to communicate digital data between an external source of the emulation system and the target microprocessor. A plurality of peripheral devices is also provided. Each of the plurality of peripheral devices emulates a predetermined portion of the target microprocessor. Each of the plurality of peripheral devices also has a plurality of bus drivers and a circuit for emulating operation of a predetermined portion of the internal circuit of the target microprocessor. Each of the plurality of bus drivers corresponding to the plurality of peripheral devices is enabled with the first voltage value. The plurality of bus drivers is enabled to communicate digital information between the plurality of peripheral devices and the target microprocessor. The circuit for emulating operation of each of the plurality of peripheral devices is enabled with the second voltage value. The plurality of peripheral devices is enabled to emulate operation of the corresponding portion of the internal circuit of the target microprocessor. The current drawn from the internal circuit of the target microprocessor and each of the circuits for emulating operation of the predetermined portion of the internal circuit of the target microprocessor of the plurality of peripheral devices is then measured.

These and other features, and advantages, will be more clearly understood from the following detailed description taken in conjunction with the accompanying drawings. It is important to note the drawings are not intended to represent the only form of the invention.

DETAILED DESCRIPTION OF A PREFERRED EMBODIMENT

Figure 1:
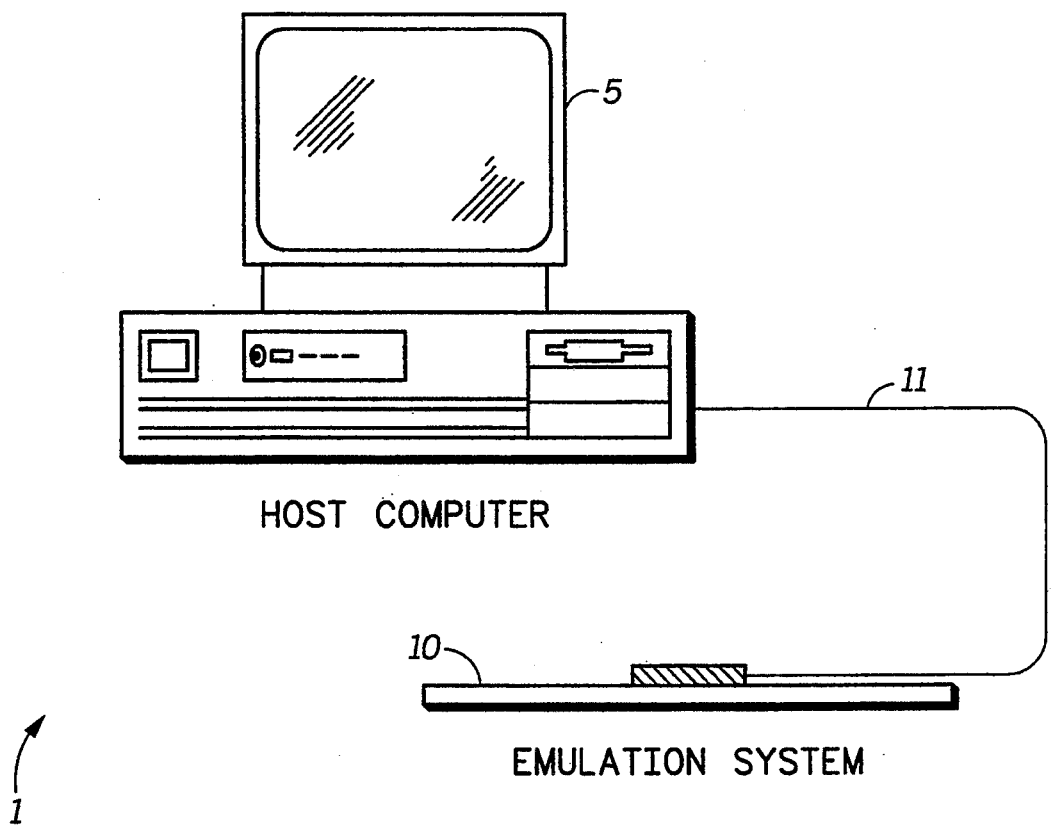
FIG. 1 illustrates in conceptual form a computer system having an emulation system in accordance with the present invention.

The present invention provides a system and a method for emulating a data processor such that power consumption of the data processor may be accurately determined. The emulation system described herein provides a savings of both time and expense over prior art solutions by allowing "real-time" power consumption analysis of a software program in a data processor. Additionally, the system described herein allows separate power analysis of a plurality of components of a data processor. The plurality of components of the data processor may include a timer circuit, an input/output circuit, or a memory. Additionally, components of the data processor which are not named above may also be analyzed separately.

The emulation system provides a plurality of circuits, each of which separately emulates operation of a specific one of the components a target microprocessor. Each of the plurality of circuits is designed or programmed to function exactly as a corresponding component would in the target microprocessor. Additionally, two isolated power supplies are provided to both the target microprocessor and each of the separate circuits. A first power supply provides power to a plurality of bus drivers. The plurality of bus drivers enables each of the target microprocessor and the separate circuits to both receive from and output data and addresses to an external bus. A second power supply is used to power only the internal circuitry of each of the devices. Therefore, a current measuring device interposed between the second power supply and each of the circuits in the emulation system accurately reflects the current drawn by the circuits without being skewed by the current draw by the plurality of bus drivers. However, by designing the target microprocessor and the remaining portions of the emulation system such that the power supply to the internal circuitry of each of the devices is separated from the power supply to the bus drivers of each of the devices, the operating current of the internal circuitry may be accurately measured.

During a following description of the implementation of the invention, the terms "assert" and "negate," and various grammatical forms thereof, are used to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state.

A computer system 1 illustrates one environment in which the invention described herein is implemented. Computer system 1 generally includes a computer 5 and an emulation system 10. Computer 5 is connected to emulation system 10 via a conductor 11 which transmits address, data, and control information. The conductor 11 is configured to transmit data in a RS-232 format. The RS-232 format is a well known data transmission protocol in the data processing industry and will not be discussed in further detail.

Computer 5 allows a user to input information to control operation of emulation system 10. In the example described herein, the user provides a software program to test a current drawn by a data processor implemented in emulation system 10. The software program is entered in computer 5, placed in the appropriate format, and then transferred to emulation system 10 via the conductor 11.

Figure 2:
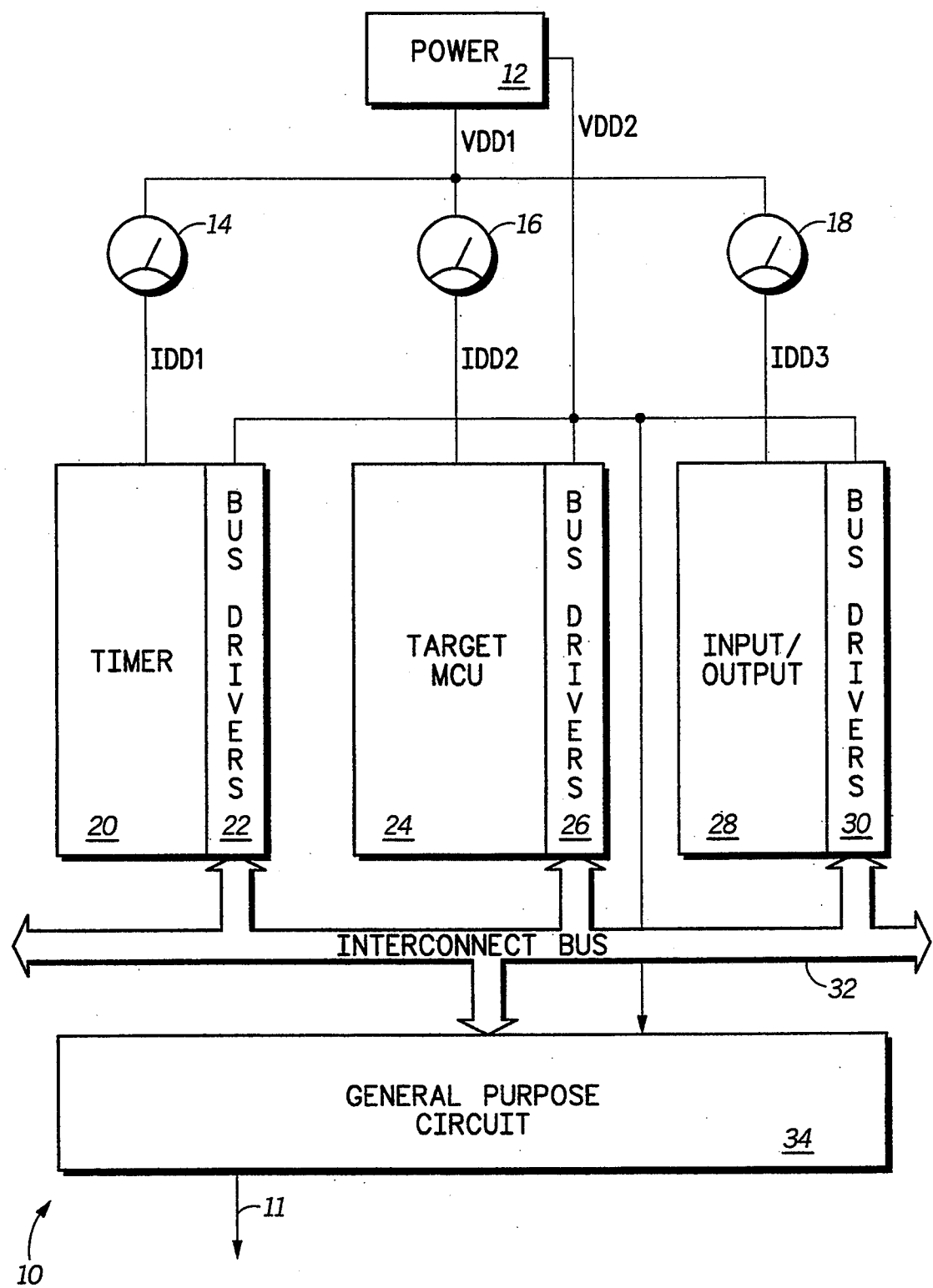
FIG. 2 illustrates in block diagram form the emulation system of FIG. 1.

Emulation system 10 is illustrated in greater detail in FIG. 2. Emulation system 10 generally includes a timer circuit 20 having a plurality of bus drivers 22, a target microcontroller (MCU) 24 having a plurality of bus drivers 26, an input/output circuit 28 having a plurality of bus drivers 30, and a general purpose circuit 34. Although not shown herein, emulation system 10 may also include other circuits which emulate specific functions performed by target MCU 24.

A first output of power supply 12 is connected to an input of each of current meter 14, current meter 16, and current meter 18 to provide a signal labeled "Vdd 1." A second output of power supply 12 is connected to an input of each of the plurality of bus drivers 22, the plurality of bus drivers 26, the plurality of bus drivers 30, and general purpose circuit 34 to provide a signal labeled "Vdd 2." Each of the plurality of bus drivers 22, 26, and 30 are connected with each other and with general purpose circuit 34 via an Interconnect Bus 32. Additionally, conductor 11 is connected to general purpose circuit 34.

During operation, power supply 12 provides a positive voltage via both the Vdd 1 and Vdd 2 signals. The positive voltage is a voltage level which each is required for operation of emulation system 10. In the implementation described herein, the Vdd 1 signal is a voltage level which is generally required by low power microprocessors, such as 3 volts. The Vdd 2 signal is provided to enable each of the plurality of bus drivers 22, 26, and 30 of each of the components of the processor being tested and general purpose circuit 34 to function correctly during operation of emulation system 10. Generally, these components of emulation system 10 require a greater amount of power than timer 20, target MCU 24, and input/output circuit 28. Therefore, the Vdd 2 signal is generally a voltage level of 5 volts. The voltage levels provided for the Vdd 1 and Vdd 2 signals are provided as an example and should not be limited to these values. Because the Vdd 2 signal is separated from the Vdd 1 signal, the currents drawn by each of the components of emulation system 10 which emulate operation of a microprocessor being tested may be measured separately from the components of emulation system 10 which control operation of system 10.

When the Vdd 2 signal is provided, the plurality of bus drivers 22, 24, and 28 are each enabled to receive and transmit address, data, and control information via Interconnect Bus 32. Logic design of the plurality of bus drivers 22, 26, and 30 is well known in the data processing art and will not be discussed or illustrated in further detail.

Additionally, the Vdd 2 signal is provided to general purpose circuit 34. General purpose circuit 34 includes circuitry generally necessary for operation of any emulation system. For example, general purpose circuit 34 includes a bus state analyzer, a RS-232 interface, a pseudo ROM, programmable logic arrays, a monitor ROM, and a breakpoint generator. Memory circuits (not shown) in general purpose circuit 34 may store the software program input by a user of emulation system 10 in addition to operating software routines needed to control timing and operations internal to emulation system 10.

During operation, a user of computer 5 inputs a software program for which the power consumption is to be determined. The software program is input to general purpose circuit 34 and subsequently transferred to the input/output circuit 28 of emulation system 10. Input/output circuit 28 receives the software program and subsequently provides control and information signals to enable each of timer 20, target MCU 24, and general purpose circuit 34 to execute the program. The control and information signals are provided by Interconnect Bus 32. Input/output circuit 28 imitates operation of an input/output circuit (not shown) on target MCU 24. To allow input/output circuit 28 to function in this manner, the input/output circuit on target MCU 24 is disabled.

In emulation system 10, timer 20 provides timing signals to each of target MCU 24, input/output circuit 28, and general purpose circuit 34. As was previously stated, timer 20 is designed to function as a timer implemented on target MCU 24 would during operation. To allow timer 20 to function in this manner, the timer (not shown) implemented on target MCU 24 is disabled and does not affect operation of emulation system 10.

General purpose circuit 34 includes memory circuits (not shown) which contains a monitor program to control operation of emulation system 10. The monitor program allows input/output circuit 28 to receive and transmit information. Additionally, target MCU 24 accesses the monitor program to execute the software program entered by the user of emulation system 10. General purpose circuit 34 acts as a pseudo-ROM to store the software program entered by the user of emulation system 10. General purpose circuit 34 may also include a bus state analyzer circuit to analyze address, data, and control states at predetermined points in time to obtain more information for evaluating the software program being tested. Bus state analysis is well known in the data processing art and will not be discussed in further detail. For more information about an emulation system which includes a bus state analyzer circuit, refer to the CDS8 system developed by Motorola, Inc. of Austin, Tex. The CDS8 system is described in more detail in the CDS8 System M68HC05 Family Software Operations Manual for MS-DOS Development Systems published by Motorola, Inc. in 1990.

General purpose circuit 34 may also include a breakpoint generator (not shown) to allow interruption of the software program at a predetermined point in execution of the software program. Therefore, a user could measure the current drawn up to a certain point in execution of the software program or could use the breakpoint generator to correct an error in the software program. Again, the design and use of breakpoint generators is well known in the data processing art and will not be discussed in further detail.

General purpose circuit 34 includes a RS-232 port (not shown in FIG. 2) to interface with conductor 11. Additionally, general purpose circuit 34 includes random logic circuitry and decode circuits to support each of the functions discussed herein.

While the software program is executed by emulation system 10, the currents drawn by each of timer 20, target MCU 24, and input/output circuit 28 are measured. For example, the Idd 1 current drawn by timer 20 during execution of the user software program is measured by current meter 14. Similarly, the Idd 2 current drawn by target MCU 24 is measured by current meter 16 and the Idd 3 current drawn by input/output circuit 28 is measured by current meter 18. The current consumed by each of the components of the data processor being tested may then be evaluated separately or summed to evaluate power consumption during a specific user defined software program. As was previously stated, the power supplied to each of the plurality of bus drivers 22, 24, and 28 is separate from the power supplied to each of timer 20, target MCU 24, and input/output circuit 28, respectively. Therefore, the current measured by each of current meters 14, 15, and 18 accurately measures only the current drawn by timer 20, target MCU 24, and input/output circuit 28, respectively. The large current drawn by each of the plurality of bus drivers 22, 26, and 30 is not reflected in the current measurements.

In emulation system 10, each of timer circuit 20, target MCU 24, and input/output circuit 28 is designed such that separate power supplies may be provided to the corresponding plurality of bus drivers and to the internal circuitry. By providing a separate external pin for each power supply on each device, two power supplies may be provided to each device. Additionally, each device is designed such that the plurality of bus drivers are connected to a first one of the power supplies and the internal circuitry is connected to a second one of the power supplies.

In summary, emulation system 10 provides a plurality of circuits, each of which separately emulates operation of each of the components a target microprocessor. Each circuit is built or programmed to function exactly as a corresponding component would in the target microprocessor. Additionally, two power supplies are provided to both the target microprocessor and each of the separate circuits. A first power supply is used to power a plurality of bus drivers which enable each of the target microprocessor and the separate circuits to both receive and output data onto an external bus. A second power supply is used to power only the internal circuitry of each of the devices. Therefore, a current measurement between the second power supply and each of the devices accurately reflects the current drawn by the circuitry without being skewed by the current draw by the plurality of bus drivers. Typically, such current would be overshadowed by the large current drawn by the bus drivers. However, by designing the target microprocessor and the remaining portions of the emulation system such that the power supplies to the internal circuitry of each of the devices are separated from the power supply of the bus drivers of each of the devices, the operating current of the internal circuitry may be accurately measured.

Emulation system 10 provides a flexible and innovative manner of evaluating the power consumption of a user software program without requiring excessive amounts of time or generating high costs. Upon loading a software program into a memory located in general purpose circuit 34, the program may be executed. Although the software program is stored in general purpose circuit 34 and not in a mask ROM on the target microprocessor, the current drawn by the mask ROM is simulated by a memory circuit on the target microprocessor. Therefore, the difference between the current drawn by the mask ROM and the memory circuit on the target microprocessor is negligible. Subsequently, the current used by each of the components of emulation system 10 during execution of the program may be selectively measured. Because each of the plurality of components of emulation system 10 emulates operation of internal components of the target data processor, the current drawn by each of the internal components of the target data processor is accurately measured. The power consumption of each of a plurality of components of the data processor may also be measured separately from one another. The measured current may then be either summed or evaluated separately depending on the needs of the user.

Additionally, emulation system 10 may be easily implemented in most current emulation systems. Most emulation systems generally have a plurality of peripheral devices in addition to a target microprocessor. The plurality of peripheral devices are required to allow a user of an emulation system to investigate portions of the target microprocessor which are typically inaccessible in certain modes of operation. By using an emulation system, a user is able to emulate operation of a certain portion of the target microprocessor for characterization. Therefore, most emulation systems include such peripheral devices and will not have to be extensively altered to add such functionality.

As well, although the target microprocessor requires two inputs for two power supplies, such changes to the integrated circuit may easily be performed through current technology. For example, a Motorola MC68HC05 microcontroller may be easily altered to have a first power supply for bus drivers and a second power supply for all remaining internal circuitry. In the design of the MC68HC05, a focused ion beam (FIB) milling tool is used to separate an external power interconnect bus which provides power to all of the bus drivers from an internal power interconnect bus. Because the interconnect bus is metal, the FIB milling tool is able to effectively separate the external bus from the internal bus. Additionally, the FIB is also able to deposit metal such that the internal power interconnect bus may be connected to an unused pin of the target microprocessor. FIB milling and deposition are commonly known skills in the data processing art and should be known to one with ordinary skill in the art.

The emulation system described herein also allows "real-time" analysis of a software program in a data processor. As soon as the data processor is manufactured, it may be tested using the emulation system described herein and a software designer is able to receive immediate feedback about the power consumption of a particular software program. The power consumption of the program may then be optimized using the emulation system. Subsequently, after the program is optimized, it may be designed in a permanent memory (ROM) of the target data processor for future mass production. Additionally, because the current is being measured from an actual integrated circuit implementation of the data processor, the current measurement is very accurate.

While optimizing the power consumption of software in a data processor has been a difficult problem for most users, the emulation system described herein provides an accurate and inexpensive solution. The emulation system eliminates the need for multiple design revisions typically needed to optimize the efficiency of a user's software code. Additionally, a characterization program to measure the current drawn by the data processor is no longer necessary. The emulation system accurately measures the current and allows a user the ability to modify the code without additional design. Therefore, both time and money are saved.

The implementation of the invention described herein is provided by way of example only. However, many other implementations may exist for executing the function described herein. For example, emulation system may model circuits other than those illustrated in FIG. 2. For example, a phase lock loop circuit or a counter might also be added. The circuits to be emulated depend upon the needs of the user and are provided accordingly.

In some implementations of the invention, the Vdd 1 and Vdd 2 voltage values may be equal to one another. While not shown in FIG. 2, when the Vdd 1 voltage value does not equal the Vdd 2 voltage value, a voltage translation circuit is needed to enable the voltage values to interface with one another. Voltage translation circuits are well known in the data processing art and should be easily implemented by one with ordinary skill in the art.

Additionally, separate power supplies may be used to supply voltage to each of the components of the emulation system. The power supplies may be linked together in such a manner that a single control signal may control all of the power supplies. Additionally, by linking the power supplies together, a constant voltage level may be maintained to each of the components.

In another variation of the embodiment of the invention described herein, each of the plurality of ammeters may be read manually, read by general purpose circuit 34, or read directly by the host computer. Therefore, the current measurements may be displayed in a variety of methods. For example, the current may be expressed as sum of the currents drawn by each of the components of the emulation system or singularly. Additionally, a user may choose to display RMS values or plot the current drawn with respect to time. Similarly, the current may be expressed in terms of power and energy. Being able to calculate energy is of particular importance for battery operated devices because a battery has only a certain amount of energy.

As well, general purpose circuit 34 may function to read the plurality of ammeters and then provide the current measurements to a host computer via an RS-232 interface. Additionally, general purpose circuit 34 may be able to measure the current and then generate a breakpoint based on the current value. For example, if the current is too high or too low, a user could enable a breakpoint generator in general purpose circuit 34 to output a breakpoint signal and temporarily suspend execution of a software program being tested.

Additionally, in another implementation of the invention described herein, the plurality of current meters may be used to measure a current drawn by a component external to the emulation system. For example, if a target microprocessor is programmed to turn on a lightbulb, a current meter may be added to measure the current drawn by the lightbulb. Therefore, a user would have access to both the current drawn by the target microprocessor during execution of the software program necessary to turn on the lightbulb and the current drawn by the lightbulb while turned on. Such measurements would allow a user to have a better knowledge of operation of the target microprocessor and the system in which the microprocessor will be used.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

I claim:

1. An emulation system for measuring current, comprising:

a power supply, the power supply having a first output for providing a first voltage value and a second output for providing a second voltage value;

a target microprocessor, the target microprocessor having a first plurality of bus drivers for communicating digital information and an internal circuit, the target microprocessor having a first input for receiving the first voltage value and a second input for receiving the second voltage value, the first voltage value being provided to the plurality of bus drivers and the second voltage value being provided to the internal circuit;

a plurality of peripheral devices external to the target microprocessor, each of the plurality of peripheral devices having both a circuit for emulating operation of a corresponding portion of the internal circuit of the target microprocessor and a second plurality of bus drivers, each of the plurality of peripheral devices having a first input for receiving the first voltage value and a second input for receiving the second voltage value, the first voltage value being provided to the plurality of bus drivers and the second voltage value being provided to the circuit for emulating operation; and a plurality of analog current meters, a first one of the plurality of analog current meters being coupled to the power supply for receiving the second voltage value and having a bidirectional terminal coupled to the internal circuit of the target microprocessor for measuring a first current value, a remaining portion of the plurality of analog current meters being coupled to a respective one of the plurality of peripheral devices, each of the remaining portion of the plurality of analog current meters being coupled to the power supply for receiving the second voltage value and having a bidirectional terminal coupled to the circuit for emulating operation of each of the plurality of peripheral devices.

2. The emulation system of claim 1 wherein the target microprocessor is a low power microprocessor.

3. The emulation system of claim 1 wherein a first one of the plurality of peripheral devices is an input/output circuit, the input/output circuit communicates digital information with an external source during operation of the emulation system.

4. The emulation system of claim 1 wherein a second one of the plurality of peripheral devices is a timer circuit, the timer circuit provides timing signals to the target microprocessor and the plurality of peripheral devices during operation of the emulation system.

5. The emulation system of claim 1 wherein the first voltage value is substantially equal to five volts.

6. The emulation system of claim 1 wherein the second voltage value is substantially equal to three volts.

7. The emulation system of claim 1, further comprising:
a general purpose circuit, the general purpose circuit being coupled to the power supply for receiving the first voltage value, the general purpose circuit being coupled to each of the target microprocessor and each of the plurality of peripheral devices, the general purpose circuit providing circuitry to control operation of the emulation system.

8. The emulation system of claim 7 wherein the general purpose circuit comprises a monitor memory.

9. The emulation system of claim 7 wherein the general purpose circuit comprises a bus state analyzer.

10. The emulation system of claim 7 wherein the general purpose circuit comprises a breakpoint generator.

11. The emulation system of claim 7 wherein the general purpose circuit comprises an RS-232 interface.

12. The emulation system of claim 1 wherein one of the remaining portion of the plurality of analog current meters is coupled to the power supply for receiving the first voltage and having a bidirectional terminal coupled to an external device, the one of the remaining portion of the plurality of analog current meters measuring a current drawn by the external device.

13. A method for measuring current with an emulation system, comprising the steps of:
providing a first voltage value;
providing a second voltage value;
providing a target microprocessor having a first plurality of bus drivers and an internal circuit;
enabling the internal circuit of the target microprocessor with the second voltage value, the internal circuit of the target microprocessor being enabled to execute data processing operations;
enabling the first plurality of bus drivers with the first voltage value, the first plurality of bus drivers being enabled to communicate digital data between an external source of the emulation system and the target microprocessor;
providing a plurality of peripheral devices wherein each of the plurality of peripheral devices emulates a predetermined portion of the target microprocessor, each of the plurality of peripheral devices having a plurality of bus drivers and a circuit for emulating operation of a predetermined portion of the internal circuit of the target microprocessor;
enabling each of the plurality of bus drivers corresponding to the plurality of peripheral devices with the first voltage value, the plurality of bus drivers being enabled to communicate digital information between the plurality of peripheral devices and the target microprocessor;
enabling the circuit for emulating operation of each of the plurality of peripheral devices with the second voltage value, the plurality of peripheral devices being enabled for emulating operation of the corresponding portion of the internal circuit of the target microprocessor; and
using a plurality of analog current meters to measure a plurality of current values required during operation of the internal circuit of the target microprocessor and each of the circuits for emulating operation of each of the plurality of peripheral devices.

14. The method of claim 13 wherein the target microprocessor is a low power microprocessor.

15. The method of claim 13 wherein one of the plurality of peripheral devices is an input/output circuit, the input/output circuit communicating digital information with an external source.

16. The method of claim 13 wherein one of the plurality of peripheral devices is a timer circuit, the timer circuit providing timing signals to the target microprocessor and the plurality of peripheral devices during operation of the emulation system.

17. The method of claim 13 further comprising the step of:
coupling a general purpose circuit to the power supply for receiving the first voltage value, the general purpose circuit being coupled to the target microprocessor and each of the plurality of peripheral devices, the general purpose circuit providing circuitry to control operation of the emulation system.

18. The method of claim 17 wherein the general purpose circuit comprises a monitor memory.

19. The method of claim 17 wherein the general purpose circuit comprises a bus state analyzer.

20. The method of claim 17 wherein the general purpose circuit comprises a breakpoint generator.

21. The method of claim 17 wherein the general purpose circuit comprises an RS-232 interface.

* * * * *